US010153735B2

(12) United States Patent
Tucker

(10) Patent No.: US 10,153,735 B2
(45) Date of Patent: Dec. 11, 2018

(54) MILLIMETRE WAVE POWER AMPLIFIER AND A METHOD OF OPTIMISING SUCH A POWER AMPLIFIER

(71) Applicant: Filtronic Broadband Limited, Sedgefield (GB)

(72) Inventor: Andrew Tucker, Richmond (GB)

(73) Assignee: Filltronic Broadband Limited, Sedgefield (GB)

( * ) Notice: Subject to any disclaimer, the term of this patent is extended or adjusted under 35 U.S.C. 154(b) by 0 days.

(21) Appl. No.: 15/483,835

(22) Filed: Apr. 10, 2017

(65) Prior Publication Data

US 2017/0294882 A1    Oct. 12, 2017

(30) Foreign Application Priority Data

Apr. 11, 2016 (GB) .................................. 1606093.1

(51) Int. Cl.
| | |
|---|---|
| *H03F 1/02* | (2006.01) |
| *H03F 3/21* | (2006.01) |
| *H01P 5/12* | (2006.01) |
| *H03F 3/68* | (2006.01) |

(52) U.S. Cl.
CPC .............. *H03F 1/0233* (2013.01); *H01P 5/12* (2013.01); *H03F 3/21* (2013.01); *H03F 2200/129* (2013.01); *H03F 2200/504* (2013.01)

(58) Field of Classification Search
USPC ................................ 330/295, 124 R, 84, 286
See application file for complete search history.

(56) References Cited

U.S. PATENT DOCUMENTS

| 8,274,332 B2* | 9/2012 | Cho ..................... H03F 1/0261 330/124 R |
| 2002/0097087 A1 | 7/2002 | Petz et al. |

FOREIGN PATENT DOCUMENTS

| EP | 1 017 165 A1 | 7/2000 |
| WO | 00/08748 A1 | 2/2000 |
| WO | 03/036716 A1 | 5/2003 |
| WO | 03/038993 A2 | 5/2003 |

OTHER PUBLICATIONS

GB Search Report, Application No. GB1606093.1, dated Sep. 28, 2017.
English language abstract and computer-generated translation for EP 1 017 165 A1 extracted from Espacenet on Nov. 9, 2017, 12 pages.

* cited by examiner

*Primary Examiner* — Hieu Nguyen
(74) *Attorney, Agent, or Firm* — Howard & Howard Attorneys PLLC

(57) ABSTRACT

A millimeter (mm) wave power amplifier includes a plurality of amplifiers, each amplifier including an amplifying FET including a gate, drain and source. The mm wave power amplifier also includes an input port, an output port, a VDS port being connected to a VDS voltage source for setting the drain-source voltage of the FET, and a VGS port being connected to a VGS voltage source for setting the gate-source voltage of the FET. The output ports of the amplifiers are connected to a signal combiner and the input ports of the amplifiers are connected to a signal splitter. At least one of (a) at least two of the VGS ports are connected to different VGS voltage sources, and (b) at least two of the VDS ports are connected to different VDS voltage sources.

14 Claims, 8 Drawing Sheets

MILLIMETRE WAVE POWER AMPLIFIER AND A METHOD OF OPTIMISING SUCH A POWER AMPLIFIER

The present application claims the benefit of pending GB Patent Application Serial No. 1606093.1, filed Apr. 11, 2016, the entire disclosure of which is hereby expressly incorporated by reference.

The present invention relates to a millimeter (mm) wave power amplifier. More particularly, but not exclusively, the present invention relates to a mm wave power amplifier including a plurality of amplifiers connected in parallel, each amplifier including an amplifying FET, a VDS port connected to a VDS voltage source for setting the drain source voltage of the FET and a VGS port connected to a VGS voltage source for setting the gate source voltage of the FET, wherein not all of the VDS ports are connected to a common VDS voltage source or not all the VGS ports are connected to a common VGS voltage source, or both. More particularly, but not exclusively, the present invention relates to mm wave power amplifier including a plurality of amplifiers connected in parallel, each amplifier including an amplifying bipolar transistor, a VCE port connected to a VCE voltage source for setting the collector-emitter voltage of the transistor and a VBE port connected to a VBE voltage source for setting the base current of the transistor, wherein not all of the VCE ports are connected to a common VCE voltage source or not all the VBE ports are connected to a common VBE voltage source, or both. The present invention also relates to a method of optimising such a power amplifier including the steps of providing a mm wave signal to the power amplifier, measuring the power produced by the mm wave power amplifier and varying the voltages supplied by a plurality of the voltage sources to optimise the measured power.

It is often desired to amplify AC electrical signal. If this cannot be done by a single amplifier it is known to connect a plurality of such amplifiers together in parallel. The outputs of the amplifiers are then combined together to produce the final amplified signal. It is known in the art that when the signals from the separate amplifiers are combined they must be equal in both amplitude and phase otherwise the total power achieved may be lower than desired due to mechanisms such as destructive interference. In order to achieve this, it is desirable that all of the amplifiers in parallel are identical. $V_{Drain}$ voltages and $V_{Gate}$ voltages supplied to the amplifiers within the assembly are set to be identical to ensure that the behaviour of each amplifier is identical.

Whilst this approach works well at low frequencies it does not work well at millimeter (mm) frequencies (typically in the range 30 to 300 GHz, or more preferably 71-86 GHz). At these frequencies the wavelength of the signal to be amplified is comparable to the dimensions of each of the amplifiers. Small electrical and/or physical non-uniformities in the amplifiers become significant at such frequencies and result in each amplifier behaving slightly differently from the others. Because of this the outputs from the amplifiers may no longer exhibit equal amplitudes and/or phases and so result in degraded power combining efficiency.

In order to overcome this problem, it is known to attempt to manufacture the amplifiers to be identical. This is expensive and produces little improvement.

The present invention seeks to overcome the problems of the prior art.

Accordingly, in a first aspect, the present invention provides a mm wave power amplifier including a plurality of amplifiers, each amplifier including
an amplifying FET including a gate, drain and source;
an input port;
an output port;
a $V_{DS}$ port, the $V_{DS}$ port being connected to a $V_{DS}$ voltage source for setting the drain-source voltage of the FET;
a $V_{GS}$ port, the $V_{GS}$ port being connected to a $V_{GS}$ voltage source for setting the gate-source voltage of the FET;
the output ports of the amplifiers being connected to a signal combiner;
the input ports of the amplifiers being connected to a signal splitter;
wherein at least one of (a) at least two of the VGS ports are connected to different VGS voltage sources; and (b) at least two of the VDS ports are connected to different VDS voltage sources.

The drain-source voltages and/or gate/source voltages to at least some of the amplifiers can be varied independently of the others. The behaviour of at least some of the amplifiers can therefore be modified independently of the others by varying these voltages to compensate for the differences in behaviour of the amplifiers at these frequencies. The mm wave power amplifier according to the invention can be operated at mm wave frequencies.

Preferably the $V_{DS}$ ports are connected to a common $V_{DS}$ voltage source and at least two $V_{GS}$ ports are connected to different $V_{GS}$ voltage sources.

Preferably each $V_{GS}$ port is connected to a different $V_{GS}$ voltage source.

Alternatively, the $V_{GS}$ ports are connected to a common $V_{GS}$ voltage source and at least two $V_{DS}$ ports are connected to different $V_{DS}$ voltage sources.

Preferably each $V_{DS}$ port is connected to a different $V_{DS}$ voltage source.

Preferably each $V_{DS}$ port is connected to a different $V_{DS}$ voltage source and each $V_{GS}$ port is connected to a different $V_{GS}$ voltage source.

Preferably the mm wave power amplifier according to the invention further includes a mm wave signal source connected to the signal splitter.

Preferably the mm wave power amplifier according to the invention further includes a controller connected to at least a subset of the voltage sources, the controller being adapted to control the voltages supplied by the subset of voltage sources.

Preferably the controller controls the voltages dependent on the frequency of the signal provided to the signal splitter.

Preferably the signal splitter is a radial power splitter.

Preferably the signal combiner is a radial power combiner.

In a further aspect of the invention there is provided a mm wave power amplifier including a plurality of amplifiers, each amplifier including
an amplifying bipolar transistor including a base, a collector and an emitter;
an input port;
an output port;
a VCE port, the VCE port being connected to a VCE voltage source for setting the collector-emitter voltage of the transistor;
a VBE port, the VBE port being connected to a VBE voltage source for setting the base current of the transistor;
the output ports of the amplifiers being connected to a signal combiner;
the input ports of the amplifiers being connected to a signal splitter;

wherein at least one of (a) at least two of the VBE ports are connected to different VBE voltage sources; and (b) at least two of the VCE ports are connected to different VCE voltage sources.

Preferably the $V_{CE}$ ports are connected to a common $V_{CE}$ voltage source and at least two $V_{BE}$ ports are connected to different $V_{BE}$ voltage sources.

Preferably each $V_{BE}$ port is connected to a different $V_{BE}$ voltage source.

Alternatively, the $V_{BE}$ ports are connected to a common $V_{BE}$ voltage source and at last two $V_{CE}$ ports are connected to different $V_{CE}$ voltage sources.

Preferably each $V_{CE}$ port is connected to a different $V_{CE}$ voltage source.

Preferably each $V_{CE}$ port is connected to a different $V_{CE}$ voltage source and each $V_{BE}$ port is connected to a different $V_{BE}$ voltage source.

Preferably the mm wave power amplifier according to the invention further includes a mm wave signal source connected to the signal splitter.

Preferably the mm wave power amplifier according to the invention further includes a controller connected to at least a subset of the voltage sources, the controller being adapted to control the voltages supplied by the subset of voltage sources.

Preferably the controller controls the voltages dependent on the frequency of the signal provided to the signal splitter.

Preferably the signal splitter is a radial power splitter.

Preferably the signal combiner is a radial power combiner.

In a further aspect of the invention there is provided a method of optimising a mm wave power amplifier including the steps of (a) providing a mm wave power amplifier as claimed in any one of the claims;

(b) providing a mm wave signal to the power splitter;

(c) measuring the power at the output of the signal combiner; and, (d) varying the voltages supplied by a plurality of the voltage sources to optimise the measured power.

Preferably the power is further measured at the output of at least one of the amplifiers, preferably a plurality of amplifiers.

Preferably the step of providing a mm wave power amplifier includes the step of providing a mm wave power amplifier as claimed and wherein the voltage supplied by each VDS voltage source is held constant.

Alternatively the step of providing a mm wave power amplifier includes the step of providing a mm wave power amplifier as claimed and wherein the voltage supplied by each VCE voltage source is held constant.

The present invention will now be described by way of example only and not in any limitative sense with reference to the accompanying drawings in which FIGS. 1(a) and 1(b) show amplifiers of power amplifiers according to the invention;

Figure 1A:
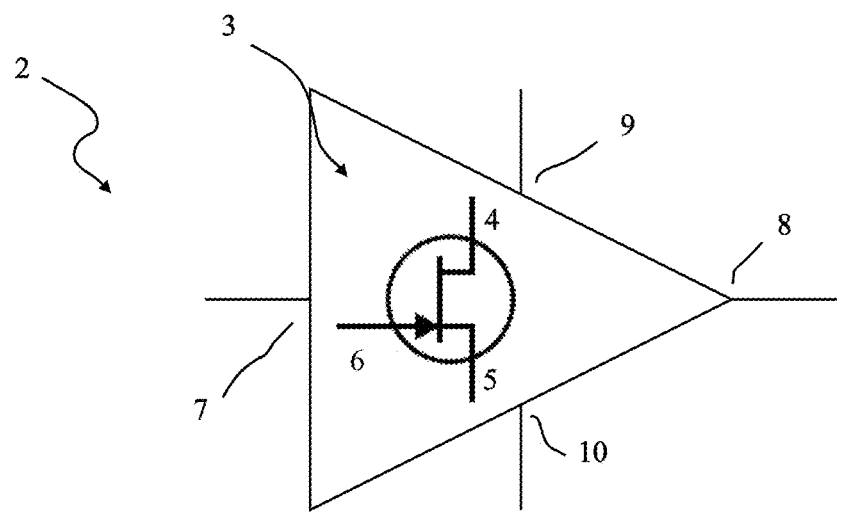

Shown in FIG. 1(a) in schematic form is a first embodiment of an amplifier 2 of a power amplifier 1 according to the invention. The amplifier 2 comprises an amplifying FET 3. The amplifying FET 3 comprises a drain 4, a source 5 and a gate 6. The operation of FETs is well known the art and will not be described in detail. The amplifier 2 comprises an input port 7 for receiving a mm wave signal. The mm wave signal is passed to the amplifying FET 3 where it is amplified and passed to an output port 8.

The amplifier 2 further comprises a $V_{DS}$ port 9. In use a $V_{DS}$ voltage source is connected to the $V_{DS}$ port 9 for setting the DC drain-source voltage of the amplifying FET 3. The amplifier 2 also comprises a $V_{GS}$ port 10. In use a $V_{GS}$ voltage source is connected to the $V_{GS}$ port 10 for setting the DC gate-source voltage of the amplifying FET 3. As is known, altering the voltages to these ports alters the behaviour of the amplifying FET 3 and hence the amplifier 2.

Figure 1B:
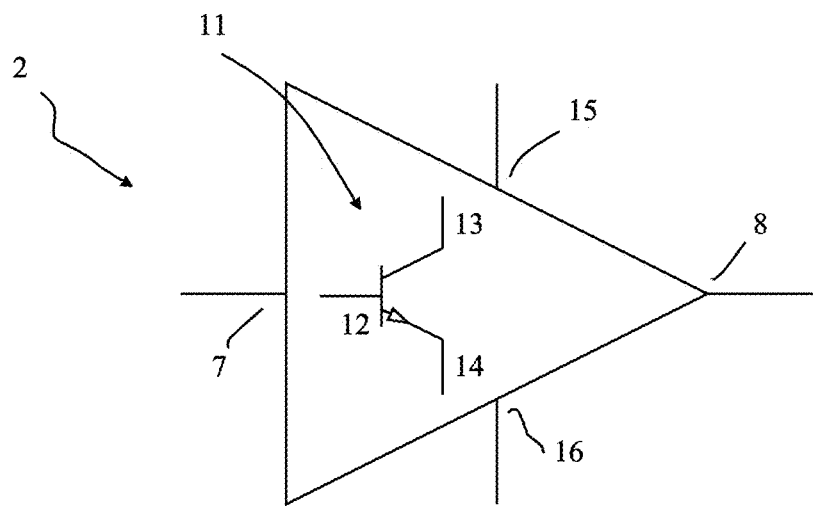

Shown in FIG. 1(b) is a further embodiment of an amplifier 2 of a power amplifier 1 according to the invention. The amplifier 2 is similar to that of FIG. 1(a) however comprises an amplifying bipolar transistor 11 rather than an amplifying FET 3. The bipolar transistor 11 comprises a base 12, a collector 13 and an emitter 14. In addition to input and output ports 7,8 the amplifier 2 comprises a $V_{CE}$ port 15 which in use is connected to a $V_{CE}$ voltage source for setting the collector-emitter voltage of the bipolar transistor 11. The amplifier 2 also comprises a $V_{BE}$ port 16 which in use is connected to a $V_{BE}$ voltage source for setting the base current of the bipolar transistor 11. As is known, altering the voltages to these ports alters the behaviour of the amplifying bipolar transistor 11 and hence the amplifier 2.

Figure 2:
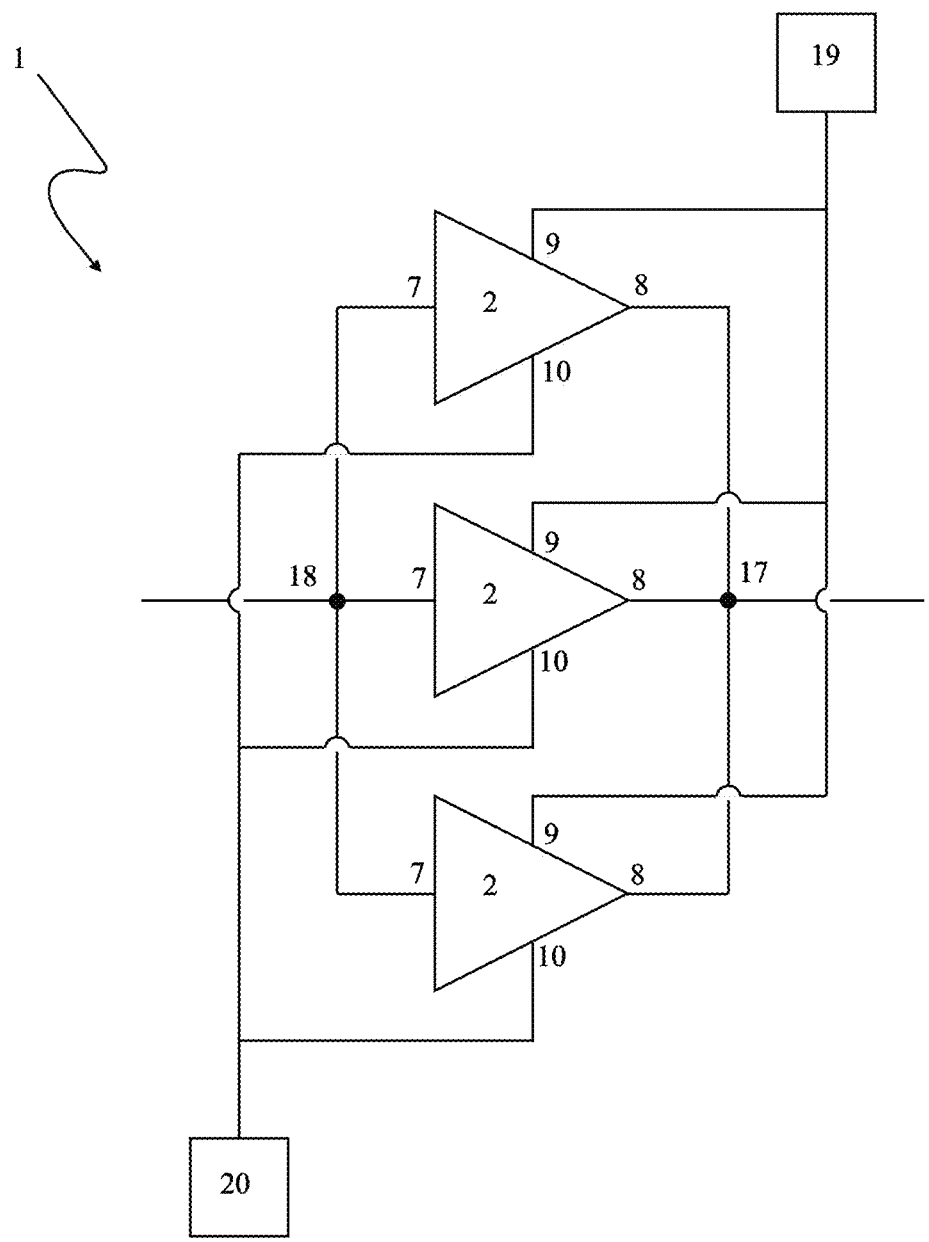
FIG. 2 shows a known power amplifier.

Shown in FIG. 2 is a known power amplifier 1. The power amplifier 1 comprises a plurality of amplifiers 2 as described with reference to FIG. 1(a). The output ports 8 of the amplifiers 2 are connected together at a signal combiner 17. The input ports 7 of the amplifiers 2 are connected together at a signal splitter 18. The three amplifiers 2 are therefore connected together in parallel. The $V_{DS}$ ports 9 are connected to a common $V_{DS}$ voltage source 20. The $V_{GS}$ ports are connected to a common $V_{GS}$ voltage source. The amplifying FETs 3 of the amplifiers 2 therefore all experience the same drain-source voltage. They also all experience the same gate-source voltage.

An input signal provided to the signal splitter 11 is split and then provided to the input ports 7 of each of the amplifiers 2. Each amplifier 2 amplifies its received signal and passes it to the signal combiner 17. The amplified signals are combined in phase at the signal combiner 17.

Such a simple power amplifier 1 works well at low frequencies. At higher (mm wavelength) frequencies the wavelength of the signal becomes comparable to the dimensions of the amplifiers 2. The amplifiers 2 are not in practice identical and have small differences between them. Because of this the output amplified signals from the amplifiers 2 are not identical and so do not combine in equal amplitude and/or phase at the signal combiner 17. This reduces the efficiency of the power amplifier 1.

Figure 3:
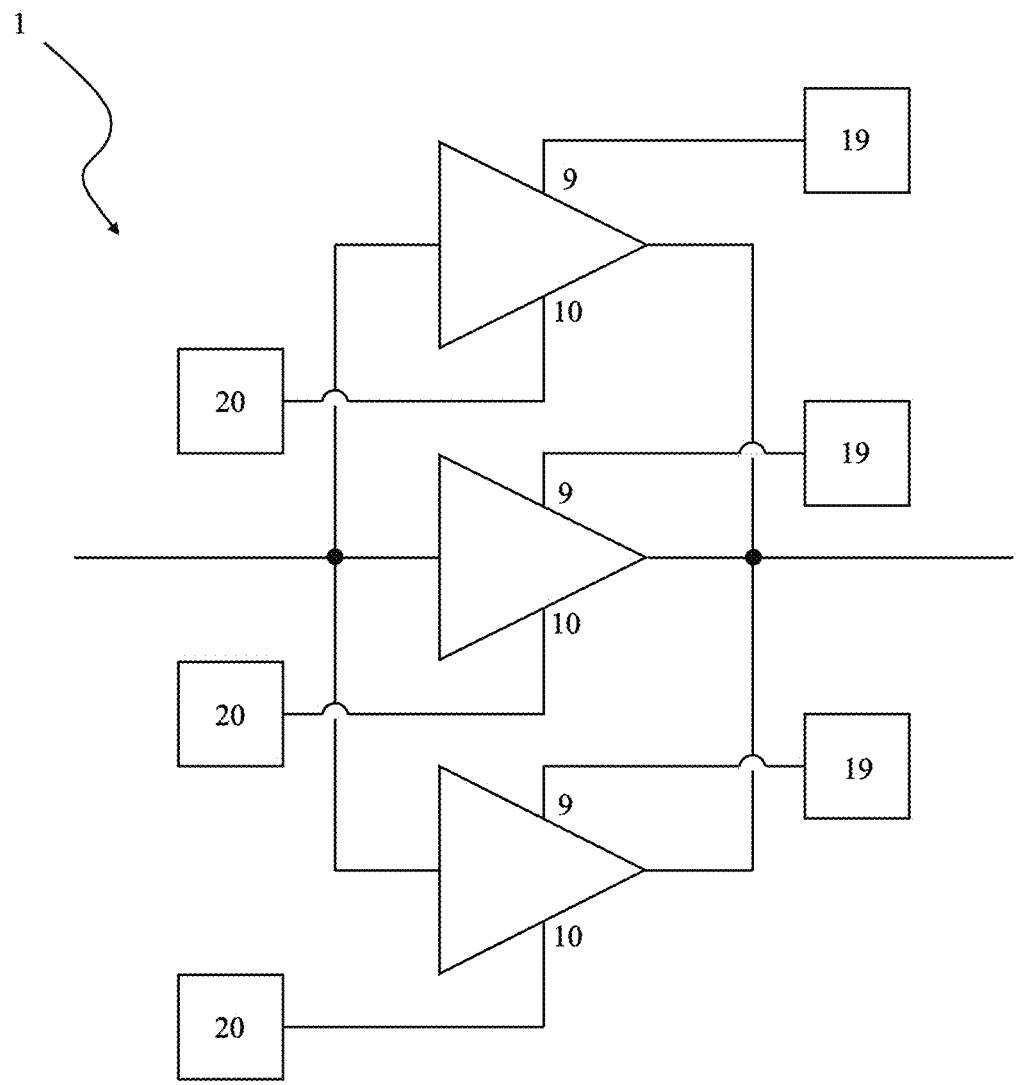
FIG. 3 shows a mm wave power amplifier according to the invention.

Shown in FIG. 3 is a mm wave power amplifier 1 according to the invention. This power amplifier 1 is similar to that of FIG. 1 except each $V_{GS}$ port 10 is connected to a separate $V_{GS}$ voltage source 20. Each $V_{DS}$ port 9 is connected to a separate $V_{DS}$ voltage source 19. Because of this the voltages applied to the $V_{DS}$ and $V_{GS}$ ports 9,10 of each amplifier 2 can be set independently of those of the other amplifiers 2. As previously described varying the voltages applied to these ports 9,10 varies the properties of the amplifier 2. By setting the $V_{DS}$ and $V_{GS}$ voltages for these amplifiers 2 appropriately one can compensate for the differences between the amplifiers 2. The power combining efficiency of the mm wave amplifier 1 according to the invention can therefore be improved at mm wave frequencies.

Figure 4:
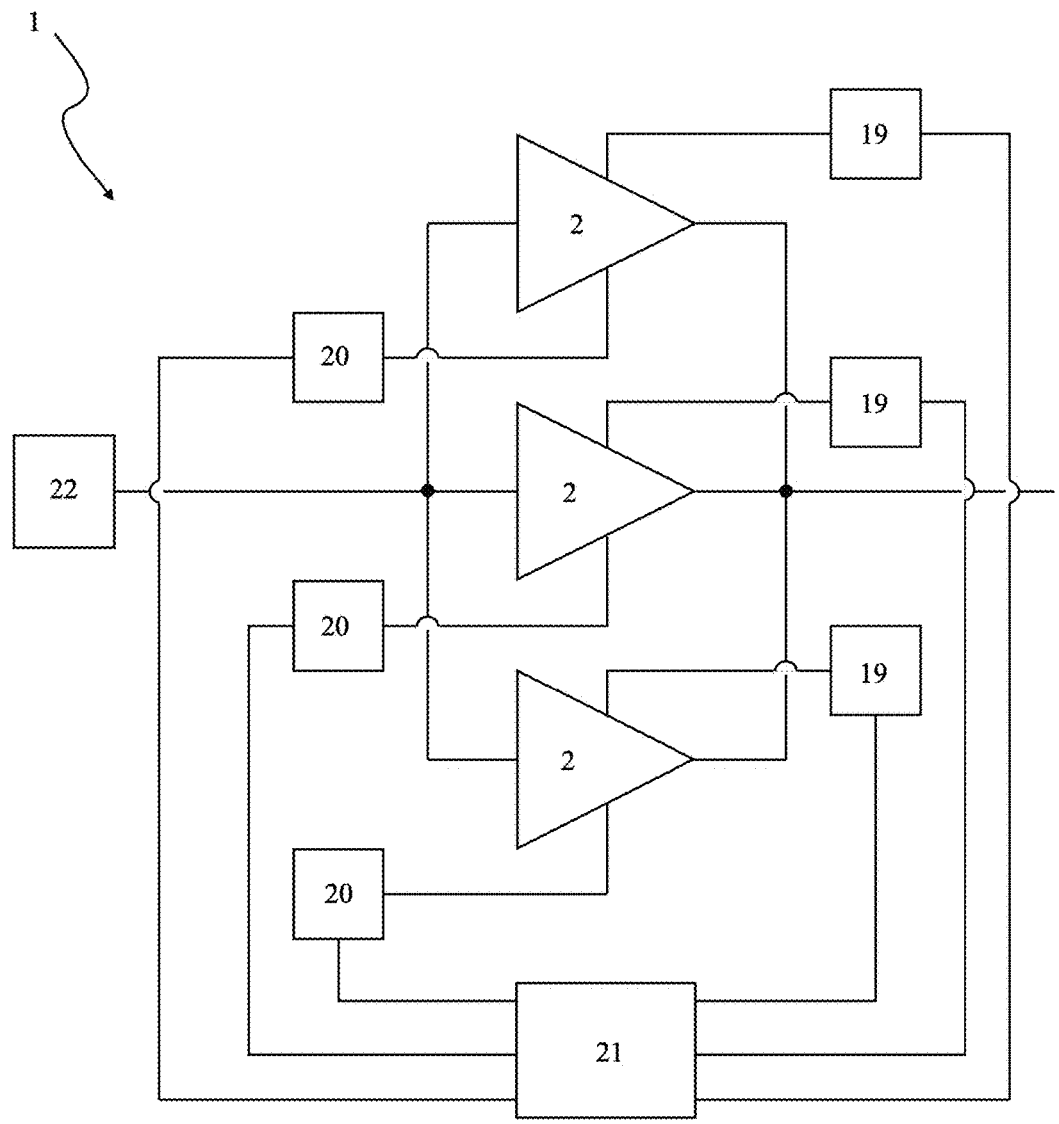
FIG. 4 shows a further embodiment of a mm wave power amplifier according to the invention.

Shown in FIG. 4 is a further embodiment of a mm wave power amplifier 1 according to the invention. This embodiment is similar to that of FIG. 3 except each voltage source 19,20 is connected to a controller 21. The controller 21 controls the voltage sources 19,20, setting the voltage provided by each voltage source 19,20 appropriately to compensate for the differences between the amplifiers 2.

The optimum voltages provided to the $V_{DS}$ and $V_{GS}$ ports 9,10 of each of the amplifiers 2 may vary with the frequency of the input signal from a signal source 22. Typically, the controller 21 holds a table of optimum voltages for each frequency of interest. The mm wave power amplifier 1 according to the invention may be attached to a frequency agile signal source 22 which hops between frequencies. When the controller 21 detects a change in the frequency of the signal from the signal source 22 it refers to the table to obtain the optimum voltages for that frequency. It then sets the voltages of the voltage sources 19,20 appropriately. In an alternative embodiment the controller 21 holds formulae of optimum voltages as a function of frequency from the signal source 22. When the controller 21 detects a change in frequency of the input signal it calculates the optimum voltages for the $V_{DS}$ and $V_{GS}$ ports 9,10 for each of the amplifiers 2 at the new frequency from the formulae. It then sets the output voltages of the voltage sources 9,10 appropriately.

Figure 5:
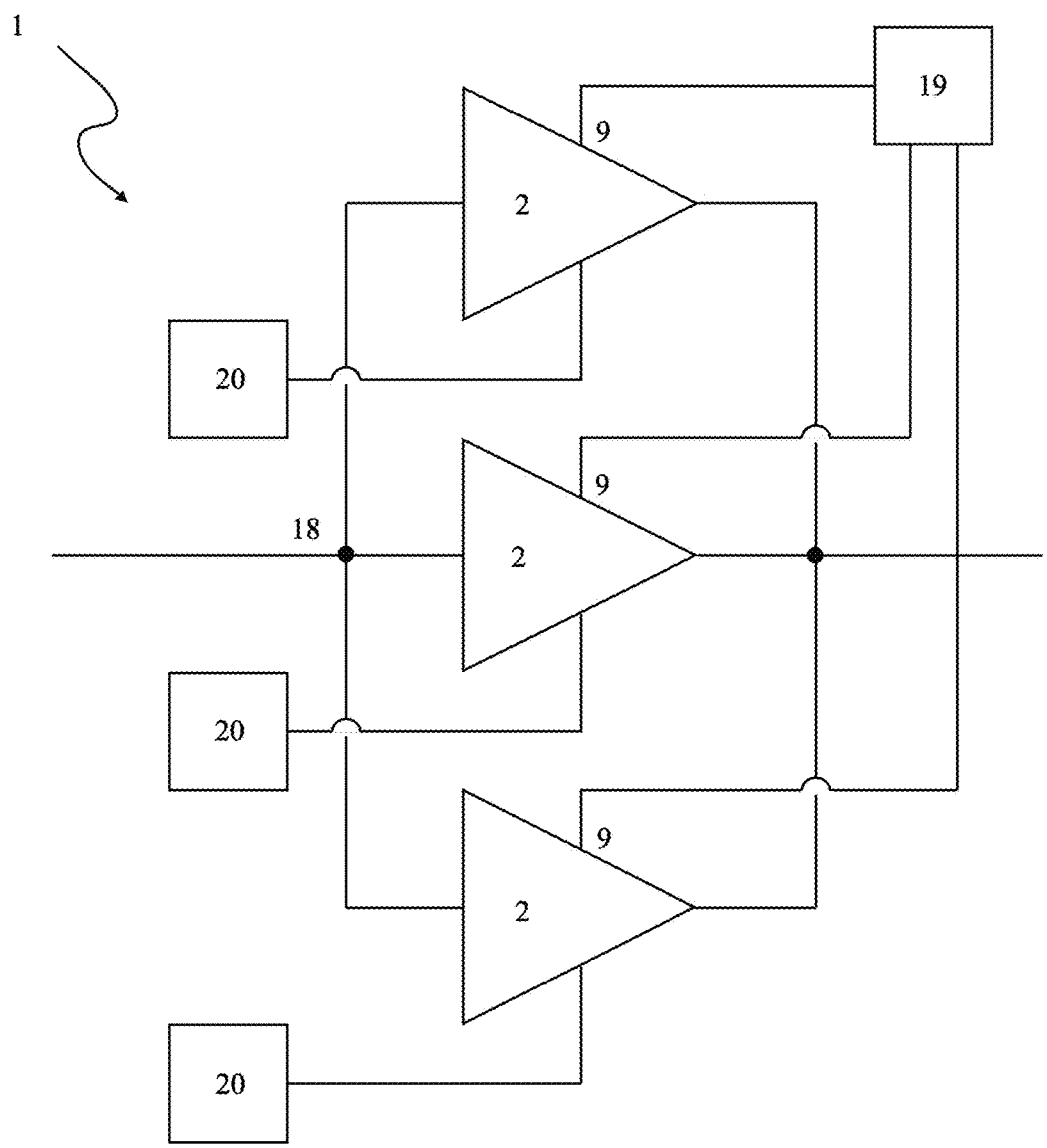
FIG. 5 shows a further embodiment of a mm wave power amplifier according to the invention.

Shown in FIG. 5 is a further embodiment of a mm wave power amplifier 1 according to the invention. In this embodiment all of the $V_{DS}$ ports 9 of the amplifiers 2 are connected to a common $V_{DS}$ voltage source 19. Each $V_{GS}$ port 10 is connected to a different $V_{GS}$ voltage source 20. In use the output voltage of the $V_{DS}$ voltage source 19 is held constant and the output voltages of the $V_{GS}$ voltage sources 20 varied in order to adjust the properties of the amplifiers 2.

In an alternative embodiment (not shown) all of the $V_{GS}$ ports 10 of the amplifiers 2 are connected to a common $V_{GS}$ voltage source 20. Each $V_{DS}$ port 9 is connected to a different $V_{DS}$ voltage source 19. In this embodiment in use the output voltage of the $V_{GS}$ voltage source 20 is held constant whilst those of the $V_{DS}$ voltage sources 19 are varied. In general, the amplifiers 2 are more sensitive to changes in $V_{GS}$ than $V_{DS}$ and accordingly this embodiment is less preferred than embodiments in which the voltages to the $V_{GS}$ ports 10 are varied.

The signal splitter 18 splits the incoming mm wave signal from a signal source 22 into a plurality of signals which are passed to the input ports 7 of the amplifiers 2. A typical signal splitter 18 is a binary splitter which splits the incoming signal into two split signals. Binary splitters can be connected together in a tree type arrangement. The input signal is split by the first binary splitter into two signals. These two signals are passed to further binary splitters and so split into four signals. This process can be repeated splitting the input signal into eight signals, sixteen signals etc as required. The amplified signals are combined into a final output signal by a reverse process employing binary combiners.

Figure 6:
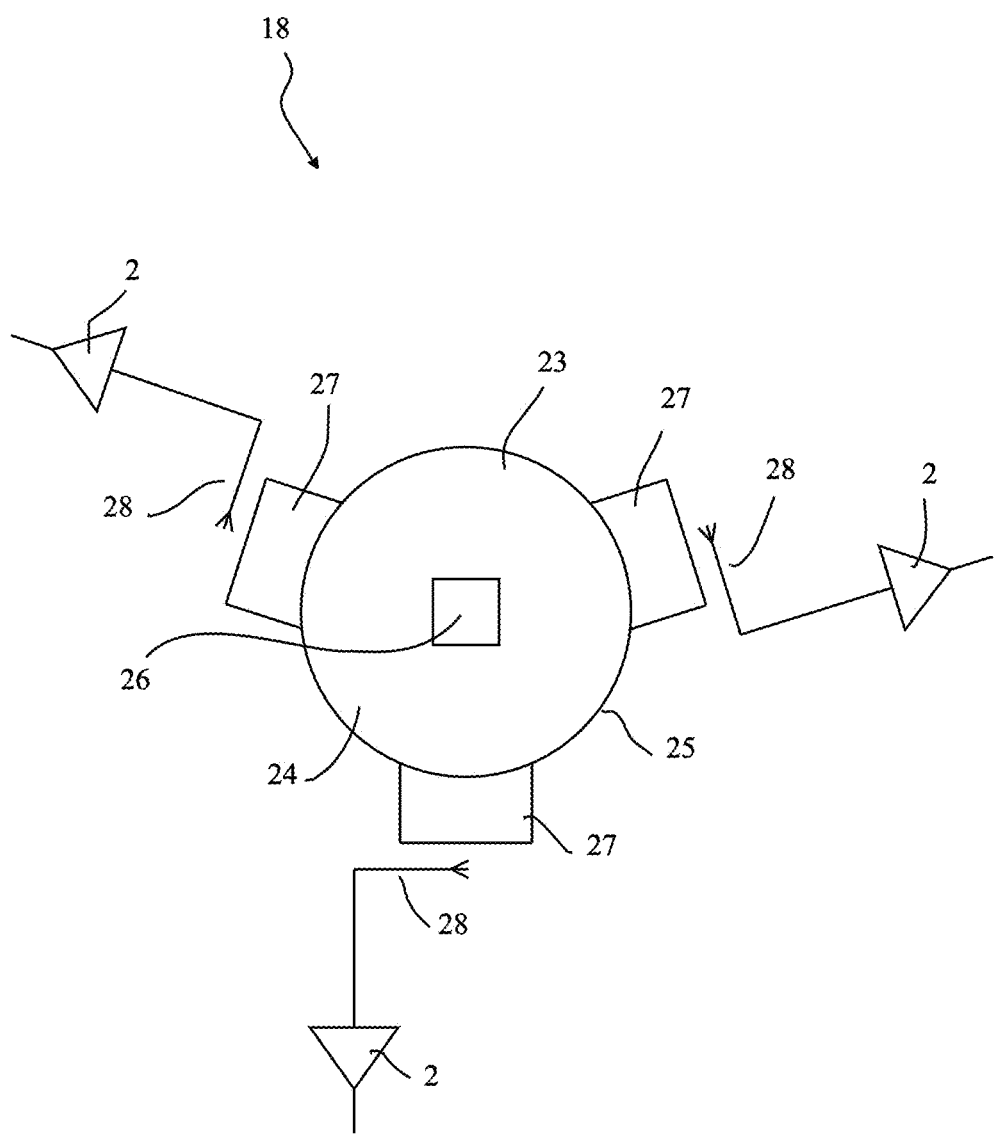
FIG. 6 shows a radial power divider of a mm wave power amplifier according to the invention.

In a preferred embodiment of the invention the signal splitter 18 is a radial power splitter. The radial power splitter 18 comprises a cylindrical resonant cavity 23 comprising a first end wall 24 and a second end wall (not shown) and a curved side wall 25 extending therebetween. The cavity 23 is shown in end view in FIG. 6. Extending from the first end wall 24 of the resonant cavity 23 is a rectangular input waveguide 26. The input signal is provided from the signal source 22 along the input waveguide 26 into the resonant cavity 23. The resonant cavity 23 has a number of output waveguides 27 extending from the curved side wall 25 of the cavity 23 and equally spaced around the side wall 25 as shown. The input signal is split equally within the cavity 23 and passes along each of the output waveguides 27. A small antenna 28 extends across the mouth of each output waveguide 27. This antenna 28 receives the split input signal and passes it to the input port 7 of an associated amplifier 2 as shown. Similarly, the signal combiner 17 is a radial power combiner where the process is reversed. The output signals from the amplifiers 2 are passed into a cylindrical resonant cavity through waveguides in the curved sidewall of the resonant cavity. The combined signal leaves the resonant cavity along a waveguide in an end wall of the resonant cavity.

Figure 7:
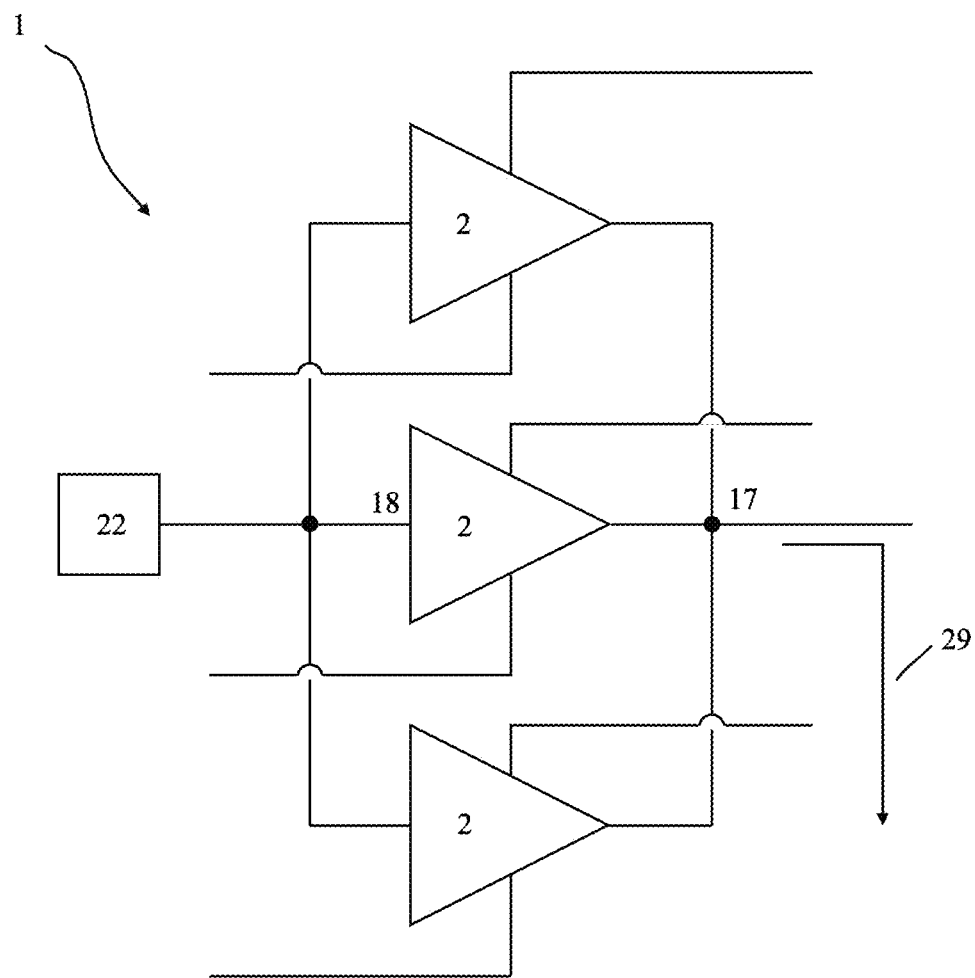
FIG. 7 shows, in schematic form, a method of optimising a mm wave power amplifier according to the invention; and, FIG. 8 shows, in schematic form, a further method of optimising a mm wave power amplifier according to the invention.

FIG. 7 shows in schematic form a method of optimising a mm wave power amplifier 1 according to the invention. The mm wave power amplifier 1 comprises three amplifiers 2. A mm wave signal is provided from a signal source 22 to the signal splitter 18. The signal is split at the signal splitter 18, amplified by the amplifiers 2 then combined at the signal combiner 17. A power meter 29 measures the power of the signal which is produced at the output side of the signal combiner 17. Voltages are supplied to the $V_{DS}$ and $V_{GS}$ ports 9,10 of the amplifiers 2. Whilst holding the amplitude of the input signal constant these voltages are varied to determine the voltages at which the output power is a maximum. These voltages are then stored and used for the future operation of the mm wave amplifier 1.

One can express the maximum power output of the mm wave power amplifier 1 as a function of the six voltages applied to the amplifiers 2 (ie the three voltages applied at the $V_{DS}$ ports 9 and the three voltages applied at the $V_{GS}$ ports 10). It is a function having six degrees of freedom. The form of the function is unknown and so must be determined experimentally. Method of experimentally determining the maximum of such a function are known. In one embodiment one systematically samples the power output at the output side of the power combiner 17 for all possible combinations of voltages applied at the $V_{DS}$ and $V_{GS}$ ports 9,10 in discreet spaced apart voltage steps. Essentially one is sampling the value of the function at grid points in the six degrees of freedom. More efficient methods are known. As an example, when the output power of the mm wave power amplifier 1 begins to increase as these voltages are varied then these voltages continue to be varied so that the output power increases. In this way one may find a 'local' maximum in the power output of the mm wave power amplifier 1. This approach may not find the global maximum of power output across all values of voltages applied to the $V_{DS}$ and $V_{GS}$ ports 9,10 however this may be sufficient. Another approach may be to assume that all such mm wave power amplifiers 1 according to the invention are substantially similar. Once one has found the values of the voltages applied to the $V_{DS}$ and $V_{GS}$ ports 9,10 corresponding to the maximum value of power output for one mm wave amplifier these values can be employed as a starting point when finding the optimum voltage values for the next mm wave power amplifier 1 according to the invention.

With a mm wave power amplifier 1 according to the invention having only three amplifiers 2 (and hence six degrees of freedom) a brute force approach to varying the voltage values applied to the $V_{DS}$ and $V_{GS}$ ports 9,10 to find the maximum power output may be possible. For a mm wave power amplifier 1 having, for example, ten amplifiers 2 (and hence twenty degrees of freedom) such an approach is not possible. One approach is to follow an uphill slope in the power output to a local maximum peak as described above. An alternative approach is to reduce the number of degrees of freedom of the problem. The amplifiers 2 tend to be more sensitive to changes in voltages applied to the $V_{GS}$ ports 10 than the $V_{DS}$ ports 9. Accordingly, in an alternative approach the voltages supplied to the $V_{DS}$ ports 9 are held constant and only the voltages to the $V_{GS}$ ports 10 varied.

Figure 8:
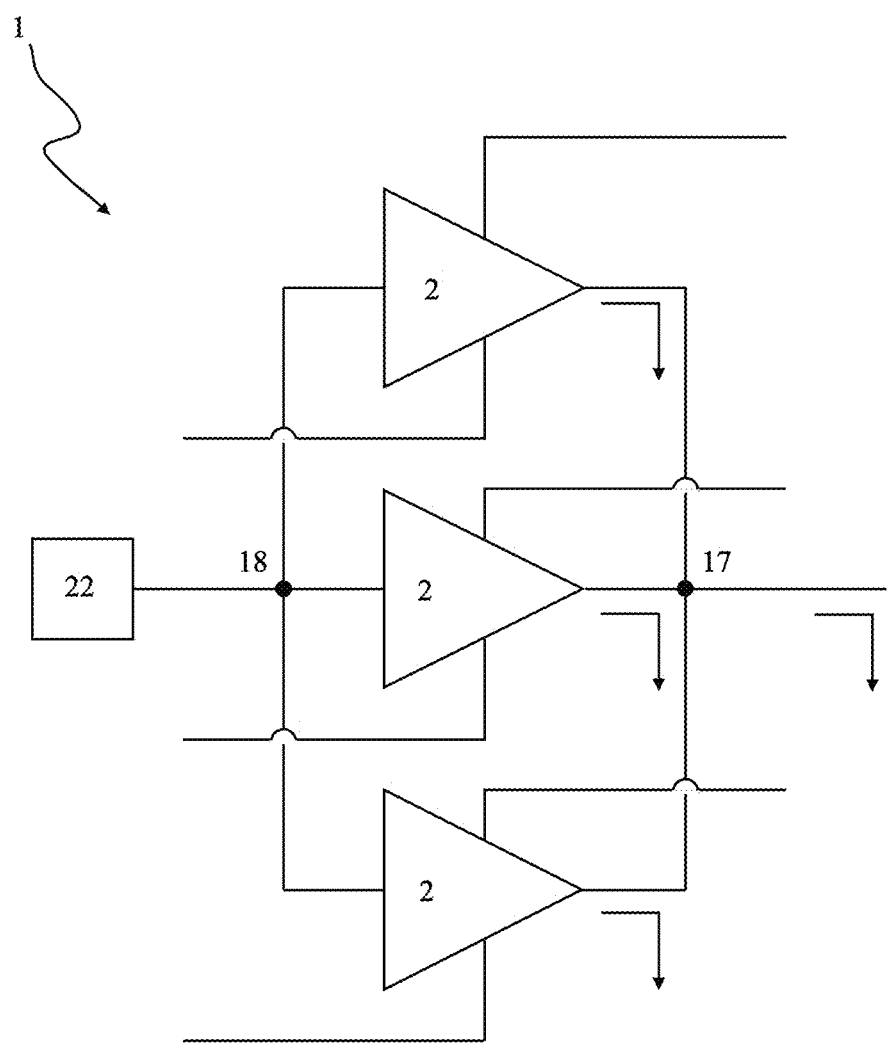

FIG. 8 shows, in schematic form, a further method of optimising a mm wave power amplifier 1 according to the invention. The method is similar to that of FIG. 7 except the output power is also measured at the output 8 of the amplifiers 2, in addition to at the output side of the signal combiner 17. Many commercially available amplifiers 2 include a port by means of which output power can be measured. An advantage of this is that if one measures the power produced from the individual amplifiers 2 one obtains a more detailed understanding of the operation of the mm wave power amplifier 1. It may be the case that if the voltages to the $V_{DS}$ and $V_{GS}$ ports 9,10 are set to produce optimum power output at the output of the signal combiner 17 and then one measures the power output of the individual amplifiers 2 then one finds that one amplifier 2 is providing far more of the power than the others. This is undesirable and reduces the life of the mm wave power amplifier 1. It is preferred that the amplifiers 2 produce substantially equal amounts of power. By measuring the output power of each of the individual amplifiers 2 one can set the voltages to the $V_{DS}$ and $V_{GS}$ ports 9,10 so that the power output at the output side of the signal combiner 17 is substantially optimum and each of the amplifiers produces approximately the same share of total power.

The invention has been described above with reference to amplifiers 2 containing amplifying FETs 3. In alternative embodiments of the invention the structure of the mm wave power amplifier 1 is the same as described above except the amplifiers 2 are as described with reference to FIG. 1(b) i.e. include amplifying bipolar transistors 11. Such embodiments employ $V_{CE}$ voltage sources connected to the $V_{CE}$ ports 15 of the amplifiers 2 and $V_{BE}$ voltage sources connected to the $V_{BE}$ ports 16 of the amplifiers 2. The methods of optimising such mm wave power amplifiers are as described with reference to FIGS. 7 and 8 although now it is the voltages to the $V_{CE}$ and $V_{BE}$ ports 15, 16 that are varied.

The invention claimed is:

1. A method of optimising a mm wave power amplifier comprising the steps of
   (a) providing a mm wave power amplifier comprising a plurality of amplifiers, each amplifier comprising:
   an amplifying FET comprising a gate, drain and source;
   an input port;
   an output port;
   a $V_{DS}$ port, the $V_{DS}$ port being connected to a $V_{DS}$ voltage source for setting the drain-source voltage of the FET; and
   a $V_{GS}$ port, the $V_{GS}$ port being connected to a $V_{GS}$ voltage source for setting the gate-source voltage of the FET;
   the output ports of the amplifiers being connected to a signal combiner;
   the input ports of the amplifiers being connected to a signal splitter;
   wherein at least one of (i) at least two of the $V_{GS}$ ports are connected to different $V_{GS}$ voltage sources; and (ii) at least two of the $V_{DS}$ ports are connected to different $V_{DS}$ voltage sources;
   (b) providing a mm wave signal to the signal splitter;
   (c) measuring the power at the output of the signal combiner; and,
   (d) varying the voltages supplied by a plurality of the voltage sources to optimise the measured power.

2. A method as claimed in claim 1, wherein the power is further measured at the output of at least one of the amplifiers.

3. A method as claimed in claim 1, wherein the voltage supplied by each $V_{DS}$ voltage source is held constant.

4. A method as claimed in claim 1, wherein the voltage supplied by each $V_{CE}$ voltage source is held constant.

5. A method as claimed in claim 1, wherein the $V_{DS}$ ports are connected to a common $V_{DS}$ voltage source and at least two $V_{GS}$ ports are connected to different $V_{GS}$ voltage sources.

6. A method as claimed in claim 5, wherein each $V_{GS}$ port is connected to a different $V_{GS}$ voltage source.

7. A method as claimed in claim 1, wherein the $V_{GS}$ ports are connected to a common $V_{GS}$ voltage source and at last two $V_{DS}$ ports are connected to different $V_{DS}$ voltage sources.

8. A method as claimed in claim 7, wherein each $V_{DS}$ port is connected to a different $V_{DS}$ voltage source.

9. A method as claimed in claim 1, wherein each $V_{DS}$ port is connected to a different $V_{DS}$ voltage source and each $V_{GS}$ port is connected to a different $V_{GS}$ voltage source.

10. A method as claimed in claim 1, wherein the mm wave power amplifier further comprises a mm wave signal source connected to the signal splitter.

11. A method as claimed in claim 1, wherein the mm wave power amplifier further comprises a controller connected to at least a subset of the voltage sources, the controller being adapted to control the voltages supplied by the subset of voltage sources.

12. A method as claimed in claim 11, wherein the controller controls the voltages dependent on the frequency of the signal provided to the signal splitter.

13. A method as claimed in claim 1, wherein the signal splitter is a radial power splitter.

14. A method as claimed in claim 1, wherein the signal combiner is a radial power combiner.

* * * * *

UNITED STATES PATENT AND TRADEMARK OFFICE
CERTIFICATE OF CORRECTION

PATENT NO. : 10,153,735 B2
APPLICATION NO. : 15/483835
DATED : December 11, 2018
INVENTOR(S) : Andrew Tucker Page 1 of 1

It is certified that error appears in the above-identified patent and that said Letters Patent is hereby corrected as shown below:

In the Claims

Column 8 Line 35: Please delete "at last" and insert: -- at least --.

Signed and Sealed this
Fourth Day of June, 2019

Andrei Iancu
*Director of the United States Patent and Trademark Office*